United States Patent
Tsai et al.

(10) Patent No.: US 8,464,136 B2
(45) Date of Patent: Jun. 11, 2013

(54) DATA TRANSFER PROTECTION APPARATUS FOR FLASH MEMORY CONTROLLER

(75) Inventors: Cheng-Ming Tsai, Hsinchu (TW); Heng-Lin Yen, Hsinchu (TW); Lian-Quan Huang, Hsinchu (TW)

(73) Assignee: Global Unichip Corporation, Hsinchu (TW)

( * ) Notice: Subject to any disclaimer, the term of this patent is extended or adjusted under 35 U.S.C. 154(b) by 255 days.

(21) Appl. No.: 12/929,241

(22) Filed: Jan. 11, 2011

(65) Prior Publication Data
US 2011/0307764 A1    Dec. 15, 2011

(30) Foreign Application Priority Data
Jun. 10, 2010   (TW) ................................ 99118832 A

(51) Int. Cl.
*G11C 29/00* (2006.01)

(52) U.S. Cl.
USPC .......................... 714/773; 714/763; 714/784

(58) Field of Classification Search
USPC .................... 714/773, 763, 782, 784, 781
See application file for complete search history.

(56) References Cited

U.S. PATENT DOCUMENTS 7,865,809 B1 *  1/2011  Lee et al. ...................... 714/782
8,291,295 B2 * 10/2012  Harari et al. .................. 714/763

\* cited by examiner

*Primary Examiner* — Fritz Alphonse
(74) *Attorney, Agent, or Firm* — Bacon & Thomas, PLLC

(57) ABSTRACT

The invention discloses a data transfer protection apparatus for a flash memory controller, placed between Bose-Chaudhuri-Hocquenghem (BCH) and NAND Flash Chip. In encode path the hardware module selects a sequence of constant values, exclusive-or the original parity with that constant value. In decode path the hardware module detects the parity period, exclusive-or the parity which is read out from NAND Flash Chip with the same constant value sequence.

14 Claims, 5 Drawing Sheets

DATA TRANSFER PROTECTION APPARATUS FOR FLASH MEMORY CONTROLLER

BACKGROUND OF THE INVENTION

1. Field of the Invention

The invention relates to a data transfer protection apparatus, particularly to a data transfer protection apparatus for a flash memory controller.

2. Description of the Prior Art

Due to the fast development of technology, there are many successful products which have already used the flash memory as mass storage medium. The goal is to improve various shortcomings of hard disk storage medium, such as the access speed, output efficiency, lifespan, volume, weight, reliability, shake resistance, carrying convenience and use convenience. Thus, how to improve various properties of mass storage medium is the goal pursued by the industry at present.

There are two kinds of flash memory, there is NOR Type Flash Memory abbreviated as NorFlash, and the other one is NAND Type Flash Memory abbreviated as NandFlash. The NorFlash has the advantages of high reliability and fast random access speed, which is widely used in the application of random access, such as the control memory of BIOS, mobile phone and hard disk driver. NandFlash is more suitable for the storage of pure data and file, such as SmartMedia card, CompactFlash card, PCMCIA ATA card and solid state disk type storage medium.

The SSD (Solid State Drive) is a store system built by NAND Flash Chip, which is used for replacing the conventional hard disk (HDD). It has the characteristics of fast read and write, quiet, low temperature, vibration resistance, power saving, small volume, and light weight, which makes fast development of SSD technique.

The data stored at NAND Flash Chip is protected by any ECC (Error-Correcting-Code) methods, like Reed Solomon or Bose-Chaudhuri-Hocquenghem (BCH). In the BCH method, each data sector of BCH-8 is 512 bytes and parity field is 13 bytes.

The prior BCH encode and decode scheme is shown in FIG. 1. For BCH encode path, the 512 byte data is send into BCH encode module 11, then generate 13 byte parity 112. Total of 525 byte data sector 111 is send into NAND Flash Chip 10 for store. For BCH decode path, the 525 byte data and 13 byte parity 131 stored in NAND Flash Chip 10 is read out and send into BCH decode module 13 for error detection and correction.

Thus, the encode flow, store flow, read flow, and then decode flow is the main BCH protection schema. 13 byte parity has to generate first for the corresponding 512 byte data sector. However at SSD application, there is one situation which cannot generate parity previously. It will make a block (one block is 1024 sectors) erase, and then write partial sectors with desired data. However, read out the whole page (one page is 8 sectors) with erased sectors and written sectors. In this situation, whole un-written sector become 0xFF, no matter the data field or parity field. It means the 512 byte 0xFF data will together with 13 byte 0xFF parity, but this parity is not real. If this data and parity send into BCH decoder, the BCH decoder will become blind and don't have any error detect and correct ability cause of extremely wrong parity.

SUMMARY OF THE INVENTION

The main purpose of the invention is to provide a data transfer protection apparatus for a flash memory controller. When the flash memory circuit is transferring the data, it employs a parity control element to correct error. The data will not unable to be detected and corrected by decode module due to the cause of wrong parity.

The invention relates to a data transfer protection apparatus for a flash memory controller, comprising: an ECC encode circuit element to receive a data sequence upon storing action and generate a first parity in accordance with the data sequence; a parity control element to connect the ECC encode circuit element, receive the first parity, select a sequence of constant values and output a second parity after calculating with the first parity, the second parity is stored in a NAND Flash Chip after combining with the data sequence; the parity control element to receive the data sequence and the second parity from NAND Flash Chip upon reading the data, and output a first parity after calculating with the sequence of constant values and the second parity; and an ECC decode circuit element to connect the parity control element, receive the data sequence and decode the first parity, and check whether the data sequence is correct or not.

In addition, the invention relates to a data transfer protection apparatus for a flash memory controller, comprising: an ECC encode circuit element to receive a data sequence upon storing action and generate a first parity in accordance with the data sequence; a first parity control element to connect the ECC encode circuit element, receive the first parity, select a sequence of constant values and output a second parity after calculating with the first parity, the second parity is stored in a NAND Flash Chip after combining with the data sequence; a second parity control element to connect NAND Flash Chip, receive the data sequence and the second parity from NAND Flash Chip upon reading the data, and output a first parity after calculating with the sequence of constant values and the second parity; and an ECC decode circuit element to connect the second parity control element, receive the data sequence and decode the first parity, and check whether the data sequence is correct or not.

Therefore, the advantage and spirit of the invention can be understood further by the following detail description of invention and attached Figures.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The invention relates to a data transfer protection apparatus for a flash memory controller, which can detect and correct a finite number of errors occurred at data processing field and parity field.

Figure 1:
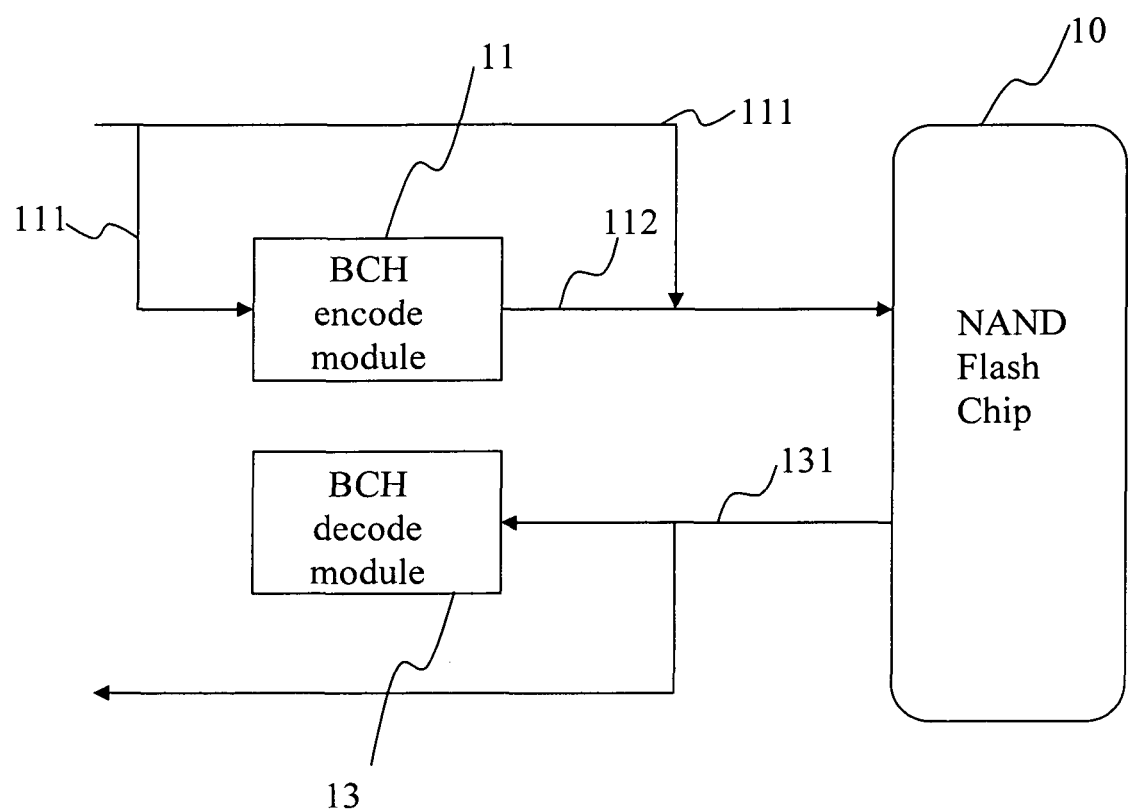
FIG. 1 is a graph illustrating the prior BCH encode and decode scheme.
Figure 2:
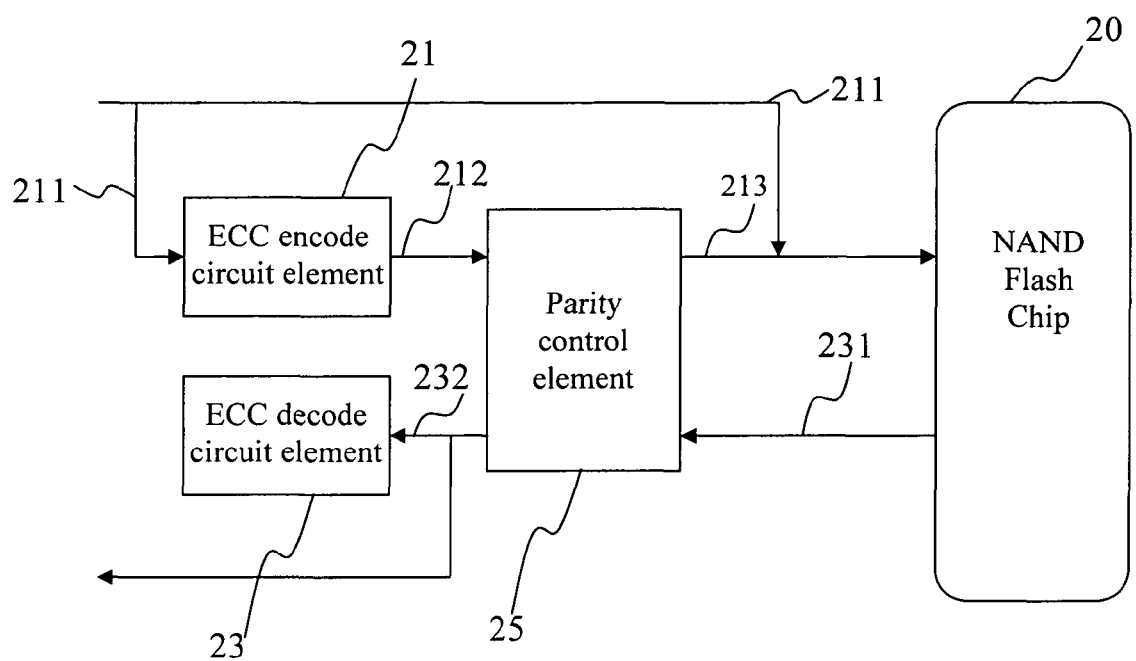
FIG. 2 is a graph illustrating the data transfer protection apparatus for the flash memory controller of the invention.

FIG. 2 is a graph illustrating the data transfer protection apparatus for a flash memory controller of the invention. The ECC encode circuit element 21 receives a data sequence 211 upon storing action and generate a first parity 212 in accordance with the data sequence 211. The first parity 212 is transferred to a parity control element 25. The parity control element 25 selects a sequence of constant values and output a second parity 213 after calculating with the first parity 212. The second parity 213 is stored in a NAND Flash Chip 20 after combining with the data sequence 211. The above-mentioned description is the encode path for storing the data sequence into the NAND Flash Chip 20. The decode path will be described as follows. The parity control element 25 receives the data sequence 211 and the second parity 231 from NAND Flash Chip 20 upon reading the data, and output a first parity 232 after calculating with the same sequence of constant values and the second parity 231. The ECC decode circuit element 23 receives the data sequence and decode the first parity 232, in order to check whether the data sequence 211 is correct or not. There will be no error between the read out parity and the original parity through the above-mentioned encode path and decode path. The elements in the parity control element 25 are shown in FIG. 3 and FIG. 4.

Figure 3:
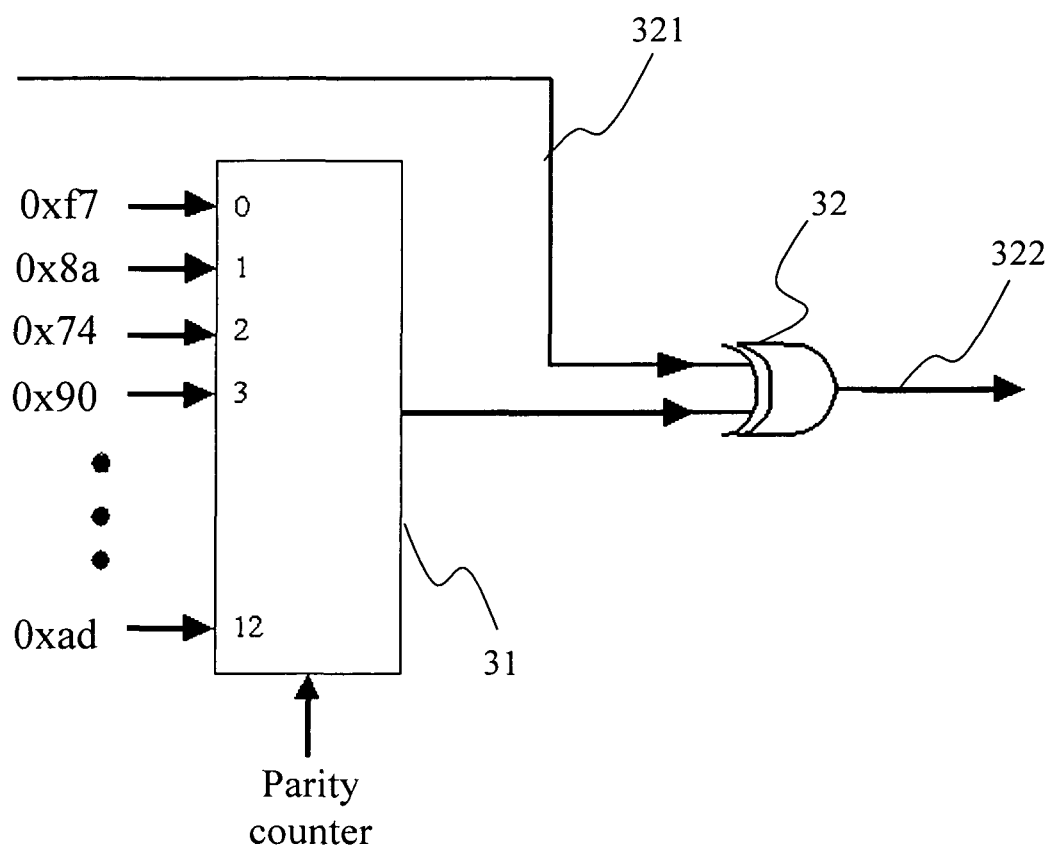
FIG. 3 is a graph illustrating the encode path for the parity control element of the invention.

FIG. 3 is a graph illustrating the encode path for the parity control element of the invention. The encode path of parity control element 25 has a multiplexer 31 which can receive the sequence of constant values then output the sequence of constant values in sequence. The bit operation gate 32 connects the multiplexer 31 to carry out the bit operation for the sequence of constant values and the first parity 321, in order to output the second parity 322.

Figure 4:
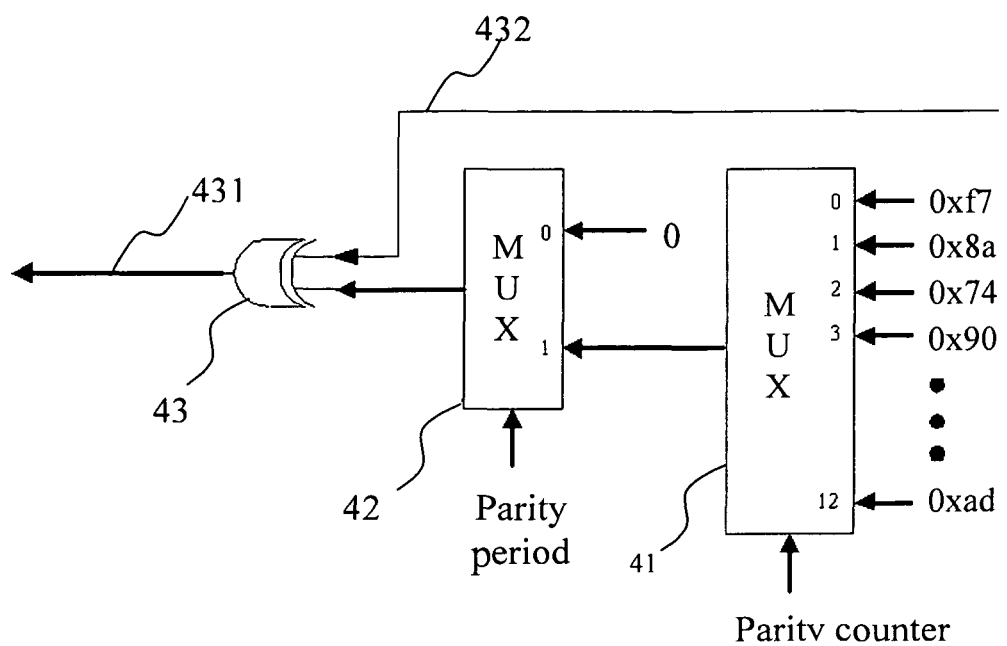
FIG. 4 is a graph illustrating the decode path for the parity control element of the invention.

FIG. 4 is a graph illustrating the decode path for the parity control element of the invention. The decode path of parity control element 25 has a multiplexer 41 which can receive the sequence of constant values then output the sequence of constant values in sequence. The multiplexer 42 connects the multiplexer 41 and receives the constant values in sequence, then outputs the sequence of constant values in accordance with the parity period. The bit operation gate 43 connects the multiplexer 42 and NAND Flash Chip (not shown) to output the data sequence directly, and carries out the bit operation for the sequence of constant values and the second parity 432, in order to output the first parity 431.

Figure 5:
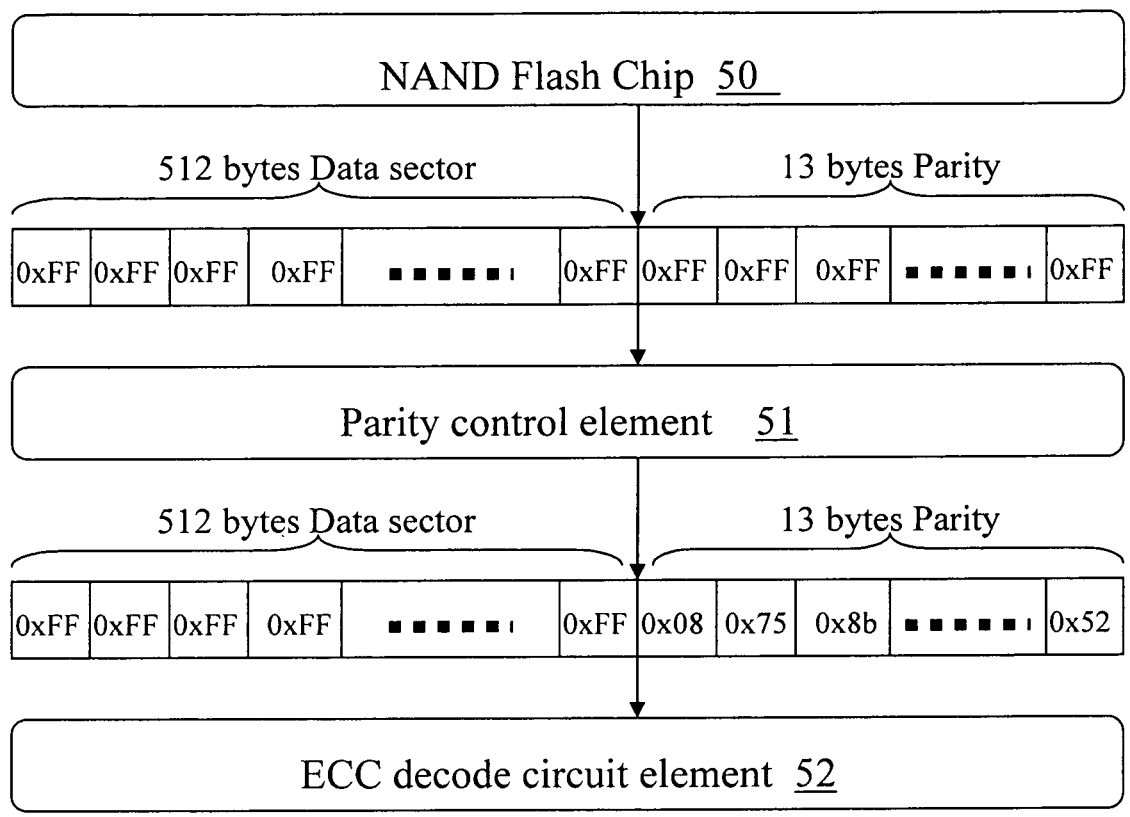
FIG. 5 is a graph illustrating the decode operation for an embodiment of the invention.

FIG. 5 is a graph illustrating the decode operation for an embodiment of the invention. If the decode operation is not carried out previously, but the decode operation is carried out after the block erase, total of 525 bytes are all 0xFF read out from the NAND Flash Chip 50, wherein the 512 byte data sector and 13 byte parity sector are all 0xFF. The 13 byte of parity data will exclusive-or a sequence of 0x08, 0x75, 0x8B, 0x6F . . . , 0x52 in the parity control element 51, then output to the ECC encode circuit element 52 without the error. If normal parities are operated through 0xF7, 0x8A, 0x74, 0x90 . . . , 0xad for the second time, they will return to the original values. The parities sent to the ECC encode circuit element will be decoded to right data. Thus any type of data will be returned to the original data generated by the ECC encode circuit element after the parity operation for two times.

In an embodiment, an ECC encode circuit element and an ECC decode circuit element are integrated to an ECC module. The ECC encode circuit element and the ECC decode circuit element carry out the same algorithm, such as Reed Solomon method or Bose-Chaudhuri-Hocquenghem (BCH) method.

In addition, the parity control element 25 is separated into independent encode path and decode path to reach the purpose of the invention.

According to the above-mentioned description, the data transfer protection apparatus for the flash memory controller, which comprises comprising: an ECC encode circuit element to receive a data sequence upon storing action and generate a first parity in accordance with the data sequence; a first parity control element to connect the ECC encode circuit element, receive the first parity, select a sequence of constant values and output a second parity after calculating with the first parity, the second parity is stored in a NAND Flash Chip after combining with the data sequence; a second parity control element to connect NAND Flash Chip, receive the data sequence and the second parity from NAND Flash Chip upon reading the data, and output a first parity after calculating with the same sequence of constant values and the second parity; and an ECC decode circuit element to connect the second parity control element, receive the data sequence and decode the first parity, and check whether the data sequence is correct or not.

A parity control element is added to the Solid State Drive. When the NAND Flash Chip stores and reads data, the parity is converted again. The conventional error can be avoided from the converted parity, and there is no effect for common data.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A data transfer protection apparatus for a flash memory controller, comprising:

an error-correcting-code encode circuit element for receiving a data sequence upon storing action and generating a first parity in accordance with the data sequence;

a parity control element for connecting the error-correcting-code encode circuit element, receiving the first parity, selecting a sequence of constant values and outputting a second parity after calculating with the first parity, the second parity being stored in a NAND Flash Chip after combining with the data sequence; wherein the parity control element for receiving the data sequence and the second parity from the NAND Flash Chip upon reading the data sequence, and outputting the first parity after calculating with the sequence of constant values and the second parity; and an error-correcting-code decode circuit element for connecting the parity control element, receiving the data sequence and decoding the first parity, and checking whether the data sequence being correct or not.

2. The apparatus according to claim 1, wherein the error-correcting-code encode circuit element and the error-correcting-code decode circuit element are integrated to an error-correcting-code module.

3. The apparatus according to claim 2, wherein the error-correcting-code encode circuit element and the error-correcting-code decode circuit element carry out the same algorithm.

4. The apparatus according to claim 3, wherein the algorithm is selected from the group consisting of Reed Solomon method and Bose-Chaudhuri-Hocquenghem (BCH) method.

5. The apparatus according to claim 1, wherein the parity control element comprising:

a first multiplexer for receiving a sequence of constant values and outputting the sequence of constant values in sequence;

a bit operation gate for connecting a multiplexer to carry out the bit operation for the sequence of constant values and the first parity in order to output the second parity;

a second multiplexer for receiving the sequence of constant values and outputting the sequence of constant values in sequence;

a third multiplexer for connecting the second multiplexer, receiving the sequence of constant values in sequence, and outputting the sequence of constant values in accordance with the parity period; and a bit operation gate for connecting the third multiplexer and NAND Flash Chip to output the data sequence directly, and for carrying out the bit operation for the sequence of constant values and the second parity in order to output the first parity.

6. The apparatus according to claim 5, wherein the bit operation comprises an exclusive-or operation.

7. A data transfer protection apparatus for a flash memory controller, comprising:

an error-correcting-code encode circuit element for receiving a data sequence upon storing action and generating a first parity in accordance with the data sequence;

a first parity control element for connecting the error-correcting-code encode circuit element, receive the first parity, selecting a sequence of constant values and outputting a second parity after calculating with the first parity, the second parity being stored in a NAND Flash Chip after combining with the data sequence;

a second parity control element for connecting the NAND Flash Chip, receiving the data sequence and the second parity from the NAND Flash Chip upon reading the data, and output a first parity after calculating with the sequence of constant values and the second parity; and an error-correcting-code decode circuit element for connecting the second parity control element, receiving the data sequence and decoding the first parity, and checking whether the data sequence being correct or not.

8. The apparatus according to claim 7, wherein the error-correcting-code encode circuit element and the error-correcting-code decode circuit element comprises being integrated to an error-correcting-code module.

9. The apparatus according to claim 8, wherein the error-correcting-code encode circuit element and the ECC decode circuit element comprises carrying out the same algorithm.

10. The apparatus according to claim 9, wherein the algorithm is selected from the group consisting of Reed Solomon method and Bose-Chaudhuri-Hocquenghem (BCH) method.

11. The apparatus according to claim 7, wherein the first parity control element comprising:

a first multiplexer for receiving the sequence of constant values, outputting the sequence of constant values in sequence; and a bit operation gate for connecting the multiplexer to carry out the bit operation for the sequence of constant values and the first parity in order to output the second parity.

12. The apparatus according to claim 11, wherein the bit operation comprises the exclusive-or operation.

13. The apparatus according to claim 7, wherein the second parity control element comprising:

a second multiplexer for receiving the sequence of constant values, outputting the sequence of constant values in sequence;

a third multiplexer for connecting the second multiplexer, receiving the sequence of constant values in sequence, and outputting the sequence of constant values in accordance with the parity period; and a bit operation gate for connecting the third multiplexer and a NAND Flash Chip to output the data sequence directly, and carrying out the bit operation for the sequence of constant values and the second parity in order to output the first parity.

14. The apparatus according to claim 13, wherein the bit operation comprises the exclusive-or operation.

\* \* \* \* \*